US006781288B2

(12) United States Patent
Osborn

(10) Patent No.: US 6,781,288 B2
(45) Date of Patent: Aug. 24, 2004

(54) ULTRA-LOW FREQUENCY ACOUSTIC TRANSDUCER

(75) Inventor: Jason W. Osborn, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 52 days.

(21) Appl. No.: 10/304,976

(22) Filed: Nov. 26, 2002

(65) Prior Publication Data

US 2003/0160546 A1 Aug. 28, 2003

Related U.S. Application Data

(63) Continuation-in-part of application No. 09/258,772, filed on Feb. 26, 1999, now abandoned.
(60) Provisional application No. 60/117,433, filed on Jan. 27, 1999.

(51) Int. Cl.[7] .................. H01L 41/08
(52) U.S. Cl. .................. 310/337; 310/334
(58) Field of Search .................. 310/334, 337, 310/369

(56) References Cited

U.S. PATENT DOCUMENTS

| | | | | |
|---|---|---|---|---|
| 2,812,452 A | | 5/1956 | Harris | |
| 3,043,967 A | | 7/1962 | Clearwaters | |
| 3,100,291 A | | 8/1963 | Abbott | |
| 3,142,035 A | | 7/1964 | Harris | |
| 3,177,382 A | | 4/1965 | Green | |
| 3,182,284 A | | 5/1965 | Green | |
| 3,277,433 A | | 10/1966 | Toulis | |
| 3,702,948 A | | 11/1972 | Balamuth | |
| 3,982,144 A | | 9/1976 | Rogers et al. | |
| 4,220,887 A | | 9/1980 | Kompanek | |
| 4,420,826 A | | 12/1983 | Marshall, Jr. et al. | |
| 4,435,794 A | | 3/1984 | Marshall | |
| 4,651,044 A | | 3/1987 | Kompanek | |
| 5,103,130 A | | 4/1992 | Rolt | |
| 5,122,992 A | | 6/1992 | Kompanek | |
| 5,132,942 A | | 7/1992 | Cassone | |
| 5,155,709 A | * | 10/1992 | Flanagan et al. | 367/174 |
| 5,229,978 A | | 7/1993 | Flanagan | |
| 5,256,920 A | | 10/1993 | Porzio | |
| 5,267,223 A | * | 11/1993 | Flanagan et al. | 367/159 |
| 5,517,465 A | | 5/1996 | Nestler et al. | |
| 5,701,277 A | * | 12/1997 | Ring et al. | 367/163 |
| 5,768,216 A | * | 6/1998 | Obata et al. | 367/172 |
| 5,920,524 A | | 7/1999 | Stein et al. | |
| 6,069,845 A | * | 5/2000 | Ambs | 367/165 |
| 6,192,751 B1 | | 2/2001 | Stein et al. | |
| 6,278,658 B1 | * | 8/2001 | Skinner et al. | 367/161 |

OTHER PUBLICATIONS

Nashua's Scientific Solutions gets federal OK to test whale–finding sonar, Mass High Tech website—www.masshightech.com, Dec. 30, 2003.

* cited by examiner

*Primary Examiner*—Mark Budd
(74) *Attorney, Agent, or Firm*—Maine & Asmus

(57) ABSTRACT

An acoustic transducer design having a slotted oval-shaped shell and active transducer elements located on the inner surface of the shell is disclosed. The design provides a high power, ultra-low frequency oval projector having a number of applications, including underwater seismic prospecting and fish mitigation.

20 Claims, 3 Drawing Sheets

ULTRA-LOW FREQUENCY ACOUSTIC TRANSDUCER

RELATED APPLICATIONS

This application is a continuation-in-part of U.S. application Ser. No. 09/258,772, filed Feb. 26, 1999 now abandoned, which claims the benefit of U.S. Provisional Application No. 60/117,433, filed Jan. 27, 1999. Each of these applications is herein incorporated in its entirety by reference.

FIELD OF THE INVENTION

The invention relates to acoustic transducers, and more particularly, to a robust, high power, ultra-low frequency acoustic transducer design.

BACKGROUND OF THE INVENTION

Acoustical transducers convert electrical energy to acoustical energy, and vice-versa, and can be employed in a number of applications. In the detection of mobile vessels, for example, acoustic transducers are the primary component of sonar devices, and are generally referred to as projectors and receivers. Projectors convert electrical energy into mechanical vibrations that imparts sonic energy into the water. Receivers are used to intercept reflected sonic energy and convert the mechanical vibrations into electrical signals. Multiple projectors and receivers can be employed to form arrays for detecting underwater objects.

In a typical application, marine seismic vessels tow vibrators and discharge air guns, explosives and other acoustic projectors to generate seismic energy in marine geophysical testing. The seismic energy comprises a pressure pulse that travels through the water and underlying subsurface geologic structures. The energy is partially reflected from interfaces between the geologic structures and is detected with geophone or hydrophone sensors.

Conventional transducers, however, are associated with a number of unsolved problems. For instance, currently known transducer designs are generally not capable of producing large amounts of acoustical energy at low frequencies on the order of two kilocycles or less, and in particular, under 400 Hz. Similarly, there appears to be no transducer that operates with considerable efficiency so as to provide large power outputs over low frequency ranges.

Physical limitations on transducer design further complicate solving such deficiencies. For example, effective mechanical stress management is important for deep depth capability, as well as for the ability to produce high acoustic power levels.

Generally, the family of sonar projectors capable of generating low frequency operate in a wall flexure mode. These projectors include flextensionals, inverse flextensionals, bender discs, wall-driven ovals (also know as "WALDOs"), and slotted cylinder projectors. Slotted cylinders can typically operate at frequencies lower than the frequencies at which flextensionals and WALDOs can operate given a fixed wall thickness and effective diameter.

However, the achievabie low frequency range of such slotted cylinders is still limited (nothing below 400 Hz), given the current need for low frequency transducers. Lower frequencies can be obtained by thinning the transducer wall thickness. On the other hand, as the wall thickness is decreased, mechanical stresses due to the wall flexure increase. For flextensionals and WALDOs to match the lower frequency capability of slotted cylinders, their walls would have to be thinned to a point where hydrostatic pressures would compromise their structural integrity.

What is needed, therefore, are robust, ultra-low frequency acoustic transducer designs.

BRIEF SUMMARY OF THE INVENTION

One embodiment of the present invention provides an acoustic transducer configured for producing ultra-low frequency, high power coherent acoustic radiation. The transducer includes a projector shell having an oval cross-section with a short axis and a long axis, and a slot opening on the short axis. The outer diameter of the projector shell is at least 18 inches along the short axis. A plurality of active transducer elements are disposed along the internal surface of the projector shell, with the transducer elements adapted for coupling to a power source. The transducer operates in the frequency range under 400 Hz.

The transducer may further include an internal cylinder having an outer diameter that is less than an inner diameter of the projector shell. End caps coupled to each end of the internal cylinder secure the projector shell in place about the internal cylinder. The active transducer elements can be retained by a groove on the internal surface of projector shell. The transducer may also include a flexible water-proof material covering the projector shell or shells that is adapted to keep the active transducer elements dry in conjunction with the end caps.

Alternative embodiments may include a plurality of projector shells that are coupled to one another with their respective slot openings aligned, with each projector shell having a plurality of active transducer elements disposed along its internal surface. The plurality of active transducer elements may include, for example, at least one of piezoelectric elements, ferroelectric elements, and rare earth elements. The projector shell can be, for instance, at least one of a solid metal, solid composite, honey comb metallic, and honey comb composite.

In one particular embodiment, each projector shell has a thickness (e.g., 6 inches or less) that allows the transducer to operate in a frequency range below 120 hertz. The projector shells can be operatively coupled to form an array of acoustic projector modules that produces coherent high powered acoustic radiation. Generally, the acoustical power provided by the array can be at least doubled by doubling the number of projector shells included in the array.

Another embodiment of the present invention provides a method of manufacturing an acoustic transducer that is configured to produce ultra-low frequency, high power coherent acoustic radiation. The method includes providing a projector shell having an oval cross-section with a short axis and a long axis, a slot opening on the short axis, and an outer diameter of at least 18 inches along the short axis. The method further includes disposing a plurality of active transducer elements along the internal surface of the projector shell. The transducer elements are adapted for coupling to a power source. The transducer operates in the frequency range under 400 Hz.

The method may further include providing an internal cylinder having an outer diameter that is less than an inner diameter of the projector shell, and connecting an end cap to each end of the internal cylinder so as to secure the projector shell in place about the internal cylinder.

In alternative embodiments, providing a projector may include providing a plurality of projector shells that are coupled to one another with their respective slot openings are aligned, each projector shell having a plurality of active transducer elements disposed along its internal surface. Such embodiments may further include providing an internal cylinder having an outer diameter that is less than an inner diameter of the projector shells, and connecting an end cap to each end of the internal cylinder so as to secure the projector shells in place about the internal cylinder.

In one particular embodiment, providing a projector shell includes providing one or more projector shells each having a thickness that allows the acoustic transducer to operate in a frequency range below 120 hertz. The method may further include covering the projector shell or shells with a flexible water-proof material or boot that is adapted to keep the active transducer elements dry. In another particular embodiment, disposing the plurality of active transducer elements includes disposing the active transducer elements in a groove on the internal surface of the projector shell.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
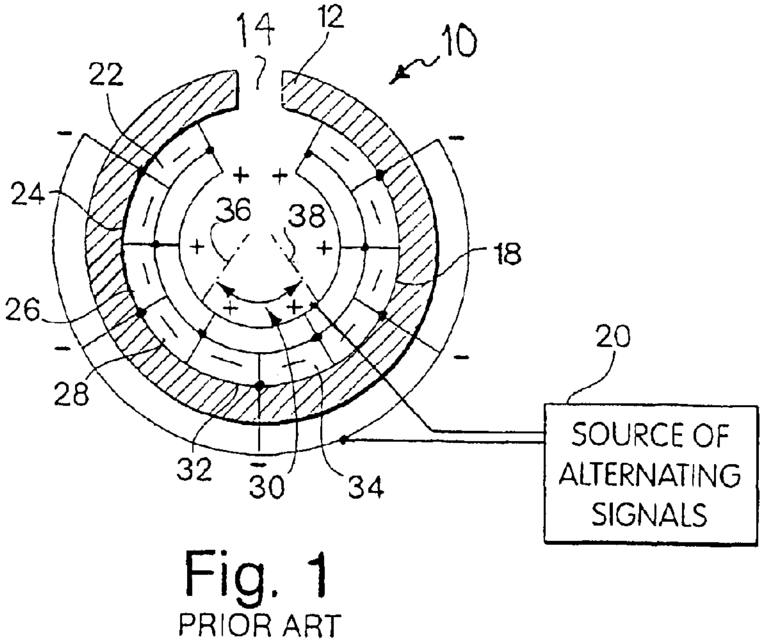
Fig. 1 PRIOR ART
FIG. 1 is cross sectional diagram of a conventional slotted cylinder transducer.

FIG. 1 is cross sectional diagram of a conventional slotted cylinder transducer 10, illustrating a well defined area of stress opposite the slot in the shell carrying the active transducer elements. Transducer 10 includes a ring-like shell 12 that is slotted so as to provide slot 14. An inner ring that includes a number of abutting active transducer elements (e.g., 22, 24, 26, 28, 32, and 34) in the form of a piezoelectric, ferroelectric, or rare earth transducers, is attached by an adhesive 18 to the inner surface of the shell 12. A source 20 of alternating current or voltage is applied as illustrated across alternating piezoelectric elements.

One characteristic associated with such a circular transducer is that an area of undistributed stress, here illustrated by reference 30, is focused on piezoelectric elements 32 and 34 in an area defined by dotted lines 36 and 38. In general, the region of shell 12 immediately opposite slot 14 tends to flex most strongly. As a result, during flexure of shell 12, large amounts of stress are applied to piezoelectric elements 32 and 34, possibly causing damage.

Note that the piezoelectric elements, including the adjacent shell 12, must be relatively thin in order to achieve a low frequency response for applications such as seismic prospecting. This thinness renders the elements susceptible to stress, and therefore fragile. In addition, non-linearities occur in the vibration of the element. This is undesirable, especially in seismic prospecting applications in which a coherent phase uniform source is required in order to be able to interpret the returns. Thus, the circular design of conventional transducers is problematic.

Figure 2:
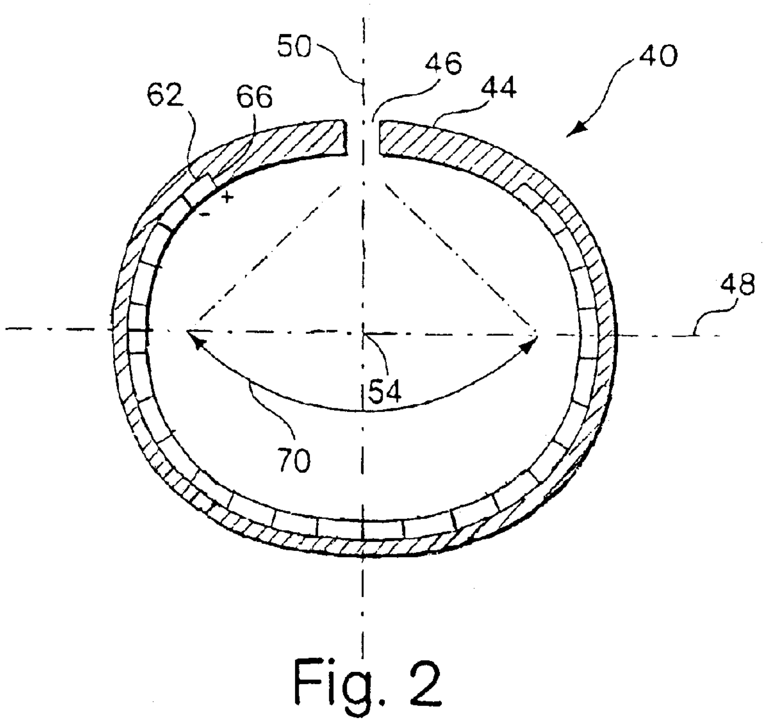
FIG. 2 is a cross sectional diagram of an oval-shaped transducer configured in accordance with one embodiment of the present invention.

FIG. 2 is a cross sectional diagram of an oval-shaped transducer 40 configured in accordance with one embodiment of the present invention. Transducer 40 is provided with a projector shell 44 having a slot opening 46. Note that the shell 44 is formed with an oval cross section. Axis 48 represents the long axis of the oval shape, while axis 50 represents the short axis of the oval shape. Intersection 54 represents the center of symmetry of the shell 44.

A distributed area of stress 70 is located opposite slot 46, and an active layer of adjacent, oppositely polarized transducer elements 62 are retained by a groove 66 on the internal surface shell 44. Configuring the elements 62 in this way enables a circumferential polarization. A source of alternating voltage or current applied across the transducer elements 62 causes the elements to vibrate, thereby producing acoustical energy.

The frequency of the vibration can be set based on, for example, the wall thickness and/or diameter of shell 44. In particular, the frequency of vibration decreases as the wall thickness decreases. Likewise the frequency of vibration decreases as the shell diameter increases.

Thus, a scaleable design approach is enabled. For instance, the diameter of the shell can be increased (about both the short and long axis) while by the wall thickness of shell 44 is maintained constant to achieve lower frequencies. An outer shell diameter of 18 inches or greater on the short axis with a wall thickness of 6.0 inches or less is capable of providing a resonant frequency below 400 Hz (e.g., 5 Hz, 10 Hz, 20 Hz, 60 Hz, 120 Hz, 200 Hz, 250 Hz, 300 Hz, or 350 Hz).

The layer of active elements 62 may include, for example, piezoelectric, ferroelectric or rare earth elements, with the shell 44 being a structural layer which is at least one of solid metal, solid composite, honey comb metallic, and honey comb composite in nature. The shell 44 can be made, for example, of aluminum, steel, titanium, graphite fiber/epoxy composite, glass fiber/epoxy composite, or other suitable projector shell materials, with the active transducer elements bonded into the groove 66 (e.g., via an insulating adhesive).

The groove 66 may be machined (e.g., drilled) or otherwise formed on the inner surface of shell 44 so as to define a thin portion and a thick portion of the shell 44. The groove 66 may also be formed by simply applying inserts (e.g., materials similar to shell materials) to both sides of slot 46. Such an embodiment allows the inner end portions of shell 44 near the slot 46 to be effectively thickened, as opposed to having the majority of the inner shell 44 wall thinned or otherwise machined. In any such cases, groove 66 is provided.

Note that the oval shape of the projector shell 44 effectively causes the inner surface of the shell 44 that is opposite slot 46 to be flatter relative to that of a circular shell design. This flattened characteristic associated with the oval shape enables the distributed area of stress 70 and effective mechanical stress management. In addition, higher power may be applied to elements 62 with lower risk of damage.

In one embodiment, shell 44 is aluminum and has a thickness of approximately 4.25 inches at the thicker portions and 1.5 inches at the thinner portion. The shell's inner diameter on the short axis is about 40.56 inches, while the outer diameter on the short axis is about 49.06 inches. The shell's inner diameter on the long axis is about 54.61 inches, while the outer diameter on the long axis is about 58.86 inches. The width of the shell 44 is about 8.0 inches.

The elements 62 are ceramic and have a height of about 1.25 inches (radial), a width of about 7.6 inches (into page), and a thickness of about 0.25 inches. Note that the elements 62 are not drawn to scale, as they appear to be thicker than they really are in this particular example embodiment. The slot 46 is approximately 5 inches in length (radial), and 4.25 inches in height.

The groove 66 has a depth of about 1.25 inches to match the height of the elements 62. Note, however, that other embodiments may have elements 62 that have a heights which are different than the groove depth. In particular, the elements 62 may have a height that is less than or greater than the groove depth. Alternatively, the elements 62 may have varying heights, some of which are less than the groove depth, and some of which are greater than the groove depth.

The thicker portions of the shell 44 to either side of slot 46 each extend to a point that is about 45 degrees from the short axis 50, thereby forming a total subtended angle of about 90 degrees measured from center point 54.

Figure 3:
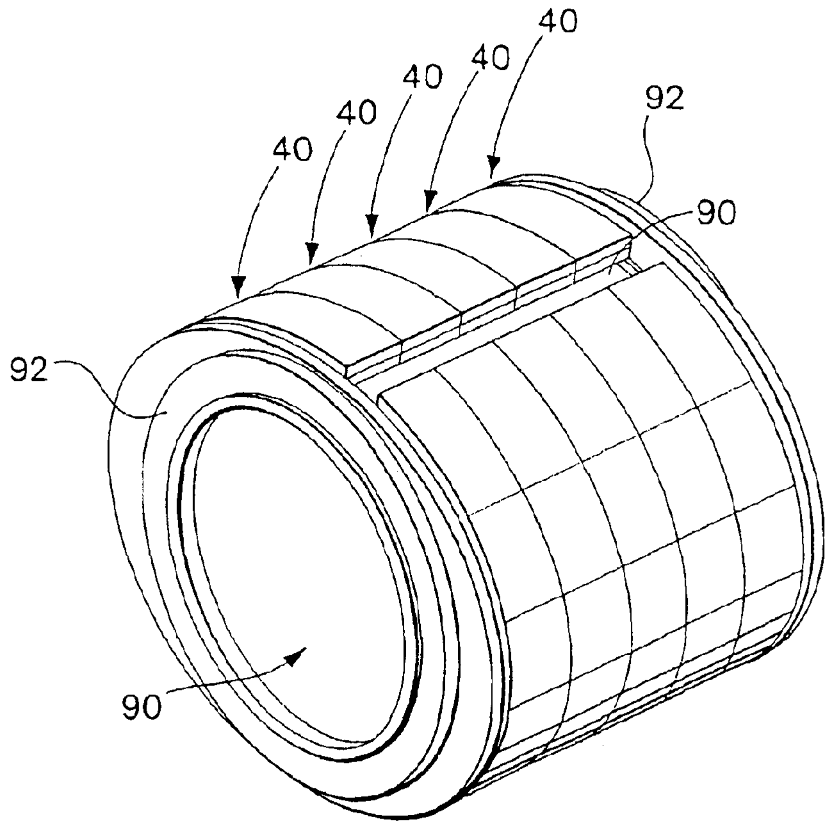
FIG. 3 is an isometric view of a number of oval-shaped transducers with aligned slots to form a transducer module configured in accordance with one embodiment of the present invention.
Figure 4:
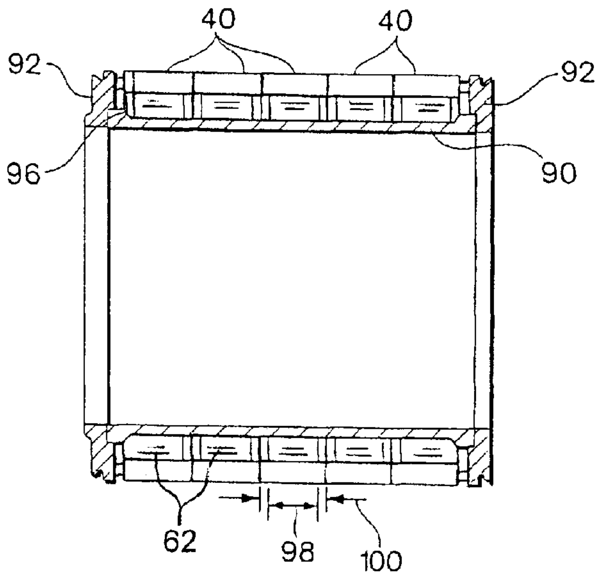
FIG. 4 is cross sectional view of the module of FIG. 3.
Figure 5:
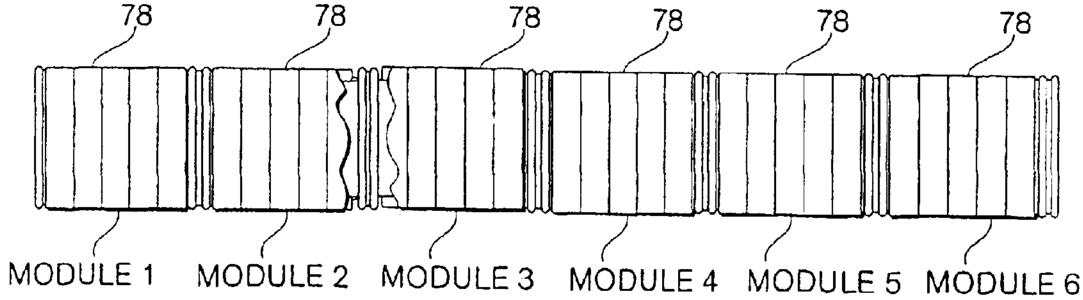
FIG. 5 is a schematic illustration of an array of acoustic projector modules configured in accordance with one embodiment of the present invention.

A frequency range of about 6 Hz to 120 Hz, with a resonant frequency of about 12 Hz, is provided by this particular embodiment. Such transducers 40 can be driven to provide about 10 acoustic watts or more over the target frequency range. Thus, when combined in an N-transducer module, $N*10^{+}$watts of radiated acoustic power is produced by the module. Such a module is illustrated in FIGS. 3 and 4, where N is equal to five, thereby projecting at least 50 acoustical watts over the frequency range of 6 Hz to 120 Hz. In addition, a number of N-transducer modules can be combined to form an acoustic array. The power of such an array is approximately M (N*10), where N is the number of transducers 40 per module, and M is the number of modules included in the array. FIG. 5 illustrates an array where M equals six and N equals five. The radiated acoustic power of this embodiment would be at least 300 acoustical watts over the frequency range of 6 Hz to 120 Hz, with the transducer elements 62 vibrating in a d33 or d31 mode.

Numerous other configurations are possible, and the present invention is not intended to be limited to any one such configuration. In particular, the shell and element dimensional parameters can be manipulated to provide other ultra-low frequencies up to 400 Hz at various power levels.

FIG. 3 is an isometric view of an oval projector module/system configured in accordance with one embodiment of the present invention. In particular, a number of oval-shaped transducers 40 (as discussed in reference to FIG. 2) are configured in a stacked array, with an internal cylinder 90 running the length of the stack. Note that the slot 46 of each transducer 40 is aligned. End caps 92 are located on cylinder 90 to secure the individual transducers 40 in place.

The cylinder 90 can be, for example, aluminum, steel, titanium, graphite fiber/epoxy composite, glass fiber/epoxy composite, or plastic. In one embodiment, the cylinder has an inner diameter of about 34.0 inches and an outer diameter of about 36.0 inches. Its ends can be threaded or otherwise machined so as to engagingly receive end caps 92. Alternatively, end caps 92 can simply be bonded in place. Guide pins and respective holes can be used to ensure proper alignment between the end caps 92 and the cylinder 90 and/or shell 44. The end caps generally should be flat, stiff, and of a structural frequency that is higher than the operating frequency of the projector (e.g., one octave of frequency higher).

The embodiment shown includes five transducers 40, but any number of transducers 40 can be included. The length of cylinder 90 will vary accordingly. In addition, a plurality of transducer modules each including N transducers 40 can be coupled together. A water-proof rubber "boot" can be employed to cover the entire radial surface to keep the module dry. A thickness is about ⅛ to ¾ inches of fiber reinforced rubber (e.g., Nylon fiber reinforced neoprene), for example, can be used as the boot. Other flexible water proofing material can be used here as well.

Other componentry not shown may also be included in the system. For example, control electronics for receiving and processing power sequences that are applied to the transducer elements 62 may be included inside the hollow of the cylinder 90. Likewise, a processor (e.g., microcontroller unit) or other smart circuitry may also be included that is programmed to carry out a specific function, such as a specific output vibration sequence (e.g., 120 Hz on for 5 seconds, off for 10 seconds, repeat). Numerous process algorithms are possible.

FIG. 4 is cross sectional view of the module of FIG. 3, and illustrates example coupling between the end transducers, the end caps, and the cylinder. In this particular embodiment, cylinder 90 has flared ends thereby defining a recessed region 96. The flared ends are bonded or otherwise coupled to respective end caps 92. Guide pins couple the end caps 92 to the adjacent transducers 40. Note that the end caps 92 need not be fastened tight against the transducers 40 on the end of the stack. This allows some mobility of the individual transducers 40.

In one embodiment, the distance between each end cap 92 and the respective transducer 40 at each end of the module is about 1.2 inches. Note that there is no physical contact between the recessed region 96 of the cylinder 90 and the inner wall of the transducers 40.

In one embodiment, the flared ends of cylinder 90 have an inner diameter of about 35.0 inches and an outer diameter of about 36.0 inches, while the recessed region 96 of cylinder 90 has an inner diameter of about 34.0 inches and an outer diameter of about 35.0 inches. About 3.0 inches of the cylinder 90 on each end is used to transition between each flared end and the recessed region 96. The width of the transducer elements 62 (FIG. 2) illustrated by arrow 98 is about 7.6 inches, and the width of the shell 44 (FIG. 2) illustrated by arrow 100 is about 8.0 inches.

FIG. 5 is a schematic illustration of an array of acoustic projector modules configured in accordance with one embodiment of the present invention. In particular, six modules (each designated as 78) are abutted end to end, with each module including five stacked oval transducer modules 40. The six modules can be, for example, about 4 feet long each for a total length of 24 feet. Generally, the length is determined by the total power needs, where the power can be doubled by doubling the length. A modular design such as this facilitates assembly, and enables power needs to be met.

The modules can be bonded together with a non-conductive adhesive. Alternatively, the modules can be coupled to one another via band clamps, or other suitable connecting mechanisms. A guide pin/hole scheme can also be employed to ensure proper alignment of the modules. Metal covers (having similar dimensions to the shells 44 so as to facilitate mating) are deployed at each end of the array.

In one particular application, the array can be towed behind a seismic prospecting research vessel that projects coherent and stable ultra-low frequency acoustic radiation into the sea water surrounding the array, with the reflections of the radiation being monitored and utilized in the seismic prospecting process. The detection of, for instance, oil and gas deposits is enabled, and repeatable results are provided with greater projector range.

In another application, the array could be used as a fish mitigation device, providing a mechanism that prevents fish from being sucked into the turbines of electrical power generating facilities. Generally stated, the ultra-low frequencies emitted by a transducer configured in accordance with the principles of the present invention act as a fish repellent.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An acoustic transducer configured for producing ultra-low frequency, high power coherent acoustic radiation comprising:

a projector shell having an oval cross-section with a short axis and a long axis, a slot opening on the short axis, and on outer diameter of at least 18 inches along the short axis; and a plurality of active transducer elements disposed along the internal surface of the projector shell, the transducer elements adapted for coupling to a power source, wherein the transducer operates in a frequency range under 400 Hz.

2. The transducer of claim 1 further comprising:

an internal cylinder having an outer diameter that is less than an inner diameter of the projector shell; and an end cap coupled to each end of the internal cylinder so as to secure the projector shell in place about the internal cylinder.

3. The transducer of claim 1 wherein a plurality of projector shells are coupled to one another with their respective slot openings aligned, each projector shell having a plurality of active transducer elements disposed along its internal surface.

4. The transducer according to claim 3 further comprising:

an internal cylinder having an outer diameter that is less than an inner diameter of the projector shells; and an end cap coupled to each end of the internal cylinder so as to secure the projector shells in place about the internal cylinder.

5. The transducer according to claim 1 further comprising:

a flexible water-proof material covering the projector shell and adapted to keep the active transducer elements dry.

6. The transducer of claim 1 wherein the plurality of active transducer elements include at least one of piezoelectric elements, ferroelectric elements, and rare earth elements, and the projector shell is at least one of a solid metal, solid composite, honey comb metallic, and honey comb composite.

7. The transducer of claim 1 wherein the active transducer elements are retained by a groove on the internal surface of the projector shell.

8. An oval projector system adapted for producing low frequency, high power coherent acoustic radiation, comprising:

one or more projector shells with an oval cross-section having a long axis, a short axis, and a slot opening, wherein each projector shell has a grooved internal surface and a diameter about the short axis of at least 18 inches;

a plurality of active transducer elements disposed along the grooved internal surface of each of the one or more projector shells, wherein the transducer elements are adapted to receive power from an alternating power source;

an internal cylinder about which the one or more projector shells are disposed, with end caps connected to each end of the internal cylinder so as to secure the projector shells;

wherein the transducer operates in a frequency range of about 5 Hz to 400 Hz.

9. The system according to claim 8 further comprising:

a flexible water-proof material covering the one or more projector shells and adapted to keep the active transducer elements dry in conjunction with the end caps.

10. The system of claim 8 wherein the plurality of active transducer elements include at least one of piezoelectric elements, ferroelectric elements, and rare earth elements, and each of the one or more projector shells is one of a solid metal, solid composite, honey comb metallic, and honey comb composite.

11. The system of claim 8 wherein the one or more projector shells each have a thickness that allows the transducer to operate in a frequency range below 120 hertz.

12. The system of claim 8 wherein a plurality of projector shells form an array of acoustic projector modules that produces coherent high powered acoustic radiation.

13. The system of claim 8 wherein acoustic power provided by the system can be at least doubled by doubling the number of projector shells included in the system.

14. The transducer of claim 1 wherein the projector shell has a thickness that allows the transducer to operate in a frequency range below 120 hertz.

15. An acoustic transducer configured for producing ultra-low frequency high power coherent acoustic radiation comprising:

a projector shell having an oval cross-section with a short axis and a long axis, a slot opening on the short axis, and an outer diameter of at least 18 inches along the short axis; and a plurality of active transducer elements on the internal surface of the projector shell, the transducer elements adapted for coupling to a power source, wherein the transducer operates in a frequency range below 120 Hz.

16. The transducer of claim 15 further comprising:

an internal cylinder having an outer diameter that is less than an inner diameter of the projector shell; and an end cap coupled to each end of the internal cylinder so as to secure the projector shell in place about the internal cylinder.

17. The transducer according to claim 15 further comprising:

a flexible water-proof material covering the projector shell and adapted to keep the active transducer elements dry.

18. The transducer of claim 15 wherein the plurality of active transducer elements include at least one or piezoelectric elements, ferroelectric elements, and rare earth elements.

19. The transducer of claim 15 wherein the projector shell is at least one of a solid metal, solid composite, honey comb metallic, and honey comb composite.

20. The transducer of claim 15 wherein the active transducer elements are retained by a groove on the internal surface of the projector shell.

* * * * *